United States Patent
Baldeck et al.

(10) Patent No.: US 11,629,203 B2
(45) Date of Patent: Apr. 18, 2023

(54) PHOTOPOLYMERISABLE COMPOSITION, MATERIAL OBTAINED BY POLYMERISING SUCH A COMPOSITION AND 3D PRINTING METHOD USING SUCH A COMPOSITION

(71) Applicants: ECOLE NORMALE SUPERIEURE DE LYON, Lyons (FR); UNIVERSITE CLAUDE BERNARD LYON 1, Villeurbanne (FR); CENTRE NATIONAL DE LA RECHERCHE SCIENTIFIQUE, Paris (FR)

(72) Inventors: Patrice Baldeck, Vizille (FR); Akos Banyasz, Lyons (FR)

(73) Assignees: ECOLE NORMALE SUPERIEURE DE LYON, Lyons (FR); UNIVERSITE CLAUDE BERNARD LYON 1, Villeurbanne (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 298 days.

(21) Appl. No.: 16/636,008

(22) PCT Filed: Jul. 31, 2018

(86) PCT No.: PCT/FR2018/051963
§ 371 (c)(1),
(2) Date: Feb. 1, 2020

(87) PCT Pub. No.: WO2019/025717
PCT Pub. Date: Feb. 7, 2019

(65) Prior Publication Data
US 2021/0189156 A1 Jun. 24, 2021

(30) Foreign Application Priority Data
Aug. 2, 2017 (FR) .......................... 1757401

(51) Int. Cl.
| | |
|---|---|
| *B29C 35/04* | (2006.01) |
| *C08F 2/46* | (2006.01) |
| *C08F 2/50* | (2006.01) |
| *C08G 61/04* | (2006.01) |
| *B33Y 10/00* | (2015.01) |
| *B33Y 40/00* | (2020.01) |
| *B33Y 70/00* | (2020.01) |
| *B29C 64/129* | (2017.01) |
| *B29C 64/371* | (2017.01) |

(Continued)

(52) U.S. Cl.
CPC .............. *C08F 2/50* (2013.01); *B29C 64/124* (2017.08); *B29C 64/129* (2017.08); *B29C 64/371* (2017.08); *B33Y 10/00* (2014.12); *B33Y 40/00* (2014.12); *B33Y 70/00* (2014.12); *C08J 3/28* (2013.01); *C09D 11/101* (2013.01); *C09D 11/107* (2013.01); *G03F 7/0037* (2013.01); *G03F 7/2055* (2013.01); *G03F 7/70416* (2013.01); *C08F 222/102* (2020.02); *C08F 222/103* (2020.02)

(58) Field of Classification Search
CPC ............ C08F 299/024; C08F 122/1006; C08F 290/14; C08F 290/06; C08F 2/50; C08F 20/18; C08F 20/10; C08F 222/102; C08F 222/103; G03F 7/2055; G03F 7/70416; G03F 7/0037; G03F 7/028; B33Y 40/00; B33Y 70/00; B33Y 10/00; B29C 64/371; B29C 64/129; B29C 64/124; C08J 3/28; C09K 11/07; C09K 2211/044; C09K 2211/185; C09K 2211/1029
USPC ........ 264/401; 522/6, 189, 184, 71, 1; 520/1
See application file for complete search history.

(56) References Cited

U.S. PATENT DOCUMENTS

| | | | |
|---|---|---|---|
| 8,197,722 | B2 | 6/2012 | Marder et al. |
| 8,846,160 | B2 | 9/2014 | Wu et al. |
(Continued)

FOREIGN PATENT DOCUMENTS

| | | |
|---|---|---|
| CN | 103483495 A | 1/2014 |
| EP | 0535828 A1 | 4/1993 |
(Continued)

OTHER PUBLICATIONS

Guney et al. "Estimation of line dimensions in 3D direct laser writing lithography", Journal of Micromechanics and Microengineering, 26, 10 (2016), 105011.

(Continued)

*Primary Examiner* — Jessica Whiteley
(74) *Attorney, Agent, or Firm* — TraskBritt

(57) ABSTRACT

A photopolymerizable composition comprises at least a polymerizable resin, a photosensitizer, an annihilator, and a photoinitiator. The photosensitizer is formulated to absorb an excitation light signal received in a first range of wavelengths. The annihilator is formulated to emit a light signal in a second range of wavelengths different from the first. During the absorption of light by the photosensitizer in the first range of wavelengths, the annihilator emits a light signal in the second range, a photon energy of the emitted light signal being greater than a photon energy of the light signal received by the photosensitizer. The annihilator is also formulated to implement an energy transfer mechanism to excite the photoinitiator for polymerization of the resin. The excited photoinitiator is formulated to generate at least one polymerizable initiator to cause the polymerization reaction. Related methods, such as three-dimensional printing methods, and materials are also disclosed.

24 Claims, No Drawings

(51) Int. Cl.

| | |
|---|---|
| *C09D 11/101* | (2014.01) |
| *C09D 11/107* | (2014.01) |
| *G03F 7/00* | (2006.01) |
| *B29C 64/124* | (2017.01) |
| *C08J 3/28* | (2006.01) |
| *G03F 7/20* | (2006.01) |
| *C08F 222/10* | (2006.01) |

(56) References Cited

U.S. PATENT DOCUMENTS

| | | |
|---|---|---|
| 2004/0067451 A1 | 4/2004 | DeVoe et al. |
| 2004/0198857 A1 | 10/2004 | Dejneka et al. |
| 2011/0021653 A1 | 1/2011 | Zheng et al. |

FOREIGN PATENT DOCUMENTS

| | | | | |
|---|---|---|---|---|
| FR | 2567668 A1 | | 1/1986 | |
| WO | 2017/093530 A1 | | 6/2017 | |
| WO | WO-2017093530 A1 | * | 6/2017 | ............ C08F 220/06 |

OTHER PUBLICATIONS

Kato et al. "Multiple-spot parallel processing for laser micronanofabrication", Applied Physics Letters, 86, 044102 (2005).

Kang et al., "Low-Threshold Photon Upconversion Capsules Obtained by Photoinduced Interfacial Polymerization," Angew. Chem. Int. Ed., vol. 51, (2012), pp. 11841-11844.

Monguzzi et al., "High Efficiency Up-Converting Single Phase Elastomers for Photon Managing Applications," Adv. Energy Mater., vol. 3, (2013), pp. 680-686.

Nelson et al., "Three-Dimensional-Printed Gas Dynamic Virtual Nozzles for X-Ray Laser Sample Delivery," Optics Express, OSA, vol. 24, No. 11 (May 18, 2016), 11515-11530.

International Search Report for International Application No. PCT/FR2018/051963, dated Nov. 9, 2018, 7 pages (including English translation).

International Written Opinion for International Application No. PCT/FR2018/051963, dated Nov. 9, 2018, 10 pages (including English machine translation).

Thiel et al., "Direct Laser Writing of Three-Dimensional Submicron Structures Using a Continuous-Wafe Laser at 532 nm," Appl. Phys. Lett., 97, (2010), 221102-1-221102-3.

Chinese First Office Action for Chinese Application No. 201880064139.9, dated Oct. 27, 2021, 15 pages with English translation.

India Patent Examination Report for India Application No. 202017008431, dated Jul. 27, 2021, 6 pages with English translation.

Singh-Rachford et al. "Photon upconversion based on sensitized triplet-triplet annihilation" Coordination Chemistry Reviews, vol. 254, Issues 21-22 (Nov. 2010) pp. 2560-2573.

* cited by examiner

PHOTOPOLYMERISABLE COMPOSITION, MATERIAL OBTAINED BY POLYMERISING SUCH A COMPOSITION AND 3D PRINTING METHOD USING SUCH A COMPOSITION

CROSS-REFERENCE TO RELATED APPLICATIONS

This application is a national phase entry under 35 U.S.C. § 371 of International Patent Application PCT/FR2018/051963, filed Jul. 31, 2018, designating the United States of America and published in French as International Patent Publication WO 2019/025717 A1 on Feb. 7, 2019, which claims the benefit under Article 8 of the Patent Cooperation Treaty to French Patent Application Serial No. 1757401, filed Aug. 2, 2017.

TECHNICAL FIELD

The present disclosure relates to the field of three-dimensional printing of objects by photopolymerization of a resin, and more specifically in this field to a photopolymerizable composition, to a material obtained by photopolymerization of such a composition and to a 3D printing method using such a composition.

BACKGROUND 3D microfabrication based on photopolymerization induced by multiphoton absorption is a technique invented in the 1990s, based on the nonlinear absorption of photosensitizers. This technique is notably described in the documents U.S. Pat. No. 8,197,722, US20040067451 or US20110021653. This technique is very effective for the three-dimensional printing of objects. However, it leads to a photopolymerization localized only at the focal point, that is to say, to a photopolymerization limited to volumes of very small dimensions with a submicron spatial resolution. The use of this particularly slow technique is thus limited to the production of objects of small dimensions, of the order of a millimeter. It furthermore requires particularly powerful pulse lasers, having an irradiance typically of the order of magnitude of a TWatt/cm$^2$.

A nonlinear photosensitization technique has also been developed based on a fluorescence upconversion mechanism for inorganic materials to excite polymerization photoinitiators suitable for the generation of radicals (for a radical polymerization) or acids (for a cationic polymerization). This technique is notably described in the document US20040198857. This technique makes it possible to use lasers having an irradiance of the order of a MWatt/cm$^2$, which remains high.

Still other documents describe 3D microfabrication methods with CW continuous lasers, for example U.S. Pat. No. 8,846,160 or M. Thiel, J. Fischer, G. V. Freymann and M. Wegener, "Direct laser writing of three-dimensional submicron structures using a continuous-wave laser at 532 nm," Appl. Phys. Lett., 97, 221102 (2010). The dimensions of the objects that can be produced remain very limited, of the order of a few tens of micrometers, and the irradiance required for the implementation remains very high, of the order of 10 MWatt/cm$^2$.

Recent publications show the possibilities and limitations in the state of the art of two-photon photopolymerization resins. Mention may be made, for example, of M. G. Guney and G. K. Fedder, "Estimation of line dimensions in 3D direct laser writing lithography," Journal of Micromechanics and Microengineering, 26, 10 (2016), 105011, and Nelson, Garrett et al., "Three-dimensional-printed gas dynamic virtual nozzles for x-ray laser sample delivery," Optics Express, 24, 14 (2016), 11515-11530. This is today the 3D printing technique having the best spatial, submicron and nanometric resolution, but the irradiance thresholds remain high, in the range of a MWatt/cm$^2$ and a TWatt/cm$^2$, the technique requires the use of ultrashort pulse lasers, the linear manufacturing speeds are limited to a few cm/s and the volume manufacturing speeds to several hours per mm$^3$.

The approach of massively parallel manufacturing by simultaneous projection of multiple laser spots can overcome the contradiction between resolution and manufacturing speed. It is commonly used with 3D printers that use the projection of masks, including high-resolution microstereolithography systems. In these cases, the photopolymerization is triggered by a simultaneous single-photon absorption of several million laser spots, which correspond to the pixels of the projected image. The axial resolution is obtained by a mechanical means of replacement of the photopolymer between each layer, which imposes a minimum thickness, typically of 5 to 10 microns. This is to be compared with photopolymerization by multiphoton absorption, for which the axial resolution, determined by the optical thickness of the image projected in the volume of the resin, is very easily submicron.

Parallel photopolymerization in multiphoton absorption conditions has already been proposed. Mention may be made, for example, of Jun-ichi Kato et al., "Multiple-spot parallel processing for laser micronanofabrication," Applied Physics Letters, 86, 044102 (2005). Given the strong irradiances required, in the range from a MWatt/cm$^2$ to a TWatt/cm$^2$, it remains limited to a few hundred laser spots, unless using extremely intense pulse lasers.

These conditions and these limited results considerably hamper the development of this technology in industrial applications.

The document PCT/EP2016/079661, published as WO 2017/093530 A1, describes a nonhomogeneous material comprising components for optical conversion, components in liquid form trapped in a matrix made of photopolymerized resin. The polymerization of the resin is initiated by a direct action of an external light signal on a polymerization photoinitiator, an action without effect on the components for optical conversion. The material obtained makes it possible to protect the components, notably from degradation of their properties by ambient oxygen.

The document "Low-Threshold Photon Upconversion Capsules Obtained by Photoinduced Interfacial Polymerization," by Ji-Hwan Kang and Elsa Reichmanis describes a similar material obtained under similar conditions. This document in fact describes a material comprising components for optical conversion, components in an oily liquid phase that are trapped in a bubble of photopolymerized resin. The polymerization of the resin is initiated by a direct action of an external light signal on an aqueous liquid composition comprising a resin and a polymerization photoinitiator, an action without effect on the components for optical conversion.

BRIEF SUMMARY

In order to overcome the disadvantages of the known techniques set out above, the present disclosure provides a novel nonlinear photopolymerizable composition in continuous and ultrasensitive light irradiance, as an alternative to multiphoton photopolymerizable compositions, especially when the manufacturing methods require projecting 2D or 3D distributions of irradiances, for example comprising numerous laser spots in the composition.

To this end, the present disclosure provides a novel photopolymerizable composition comprising at least:
- a polymerizable resin,
- a photosensitizer,
- an annihilator, and
- a photoinitiator, the photosensitizer being capable of absorbing an excitation light signal received in a first range of wavelengths, the annihilator being capable of emitting a light signal in a second range of wavelengths different from the first range of wavelengths, in which, during the absorption of light by the photosensitizer in the first range of wavelengths, the annihilator emits a light signal in the second range of wavelengths, a photon energy of the light signal emitted by the annihilator being greater than a photon energy of the light signal received by the photosensitizer, in which the annihilator is capable of implementing an energy transfer mechanism in order to excite the photoinitiator for polymerization of the resin, and in which the excited photoinitiator is capable of generating at least one polymerization initiator able to cause a polymerization reaction of the resin.

The present disclosure thus provides a composition that can be photopolymerized, not directly by the action of the excitation signal received, as is the case with the prior compositions, but indirectly by the action of the light signal emitted by the annihilator. This is because, insofar as the first range of wavelengths is distinct from the second range of wavelengths, the excitation light signal received, the wavelength of which is included in the first range of wavelengths, has no action on the photoinitiator. The photoinitiator reacts, on the other hand, under the effect of the light signal emitted by the annihilator, the central wavelength of which is included in the second range of wavelengths. Furthermore, since the photon energy of the light signal emitted by the annihilator is greater than the photon energy of the light signal received by the photosensitizer, it becomes possible to photopolymerize the resin under much more advantageous conditions, by using a light excitation signal, the energy of which is lower than the energy of the signals that it is necessary to use in the prior solutions.

According to one embodiment, the photosensitizer and the annihilator are capable of implementing together a reaction for absorption, by the photosensitizer, of two photons of the light excitation signal, followed by a reaction for the additive conversion of energy by annihilation of triplets (STTA-UC) in order to obtain an excited annihilator, the photon energy of which over the second range of wavelengths is greater than the photon energy of the excitation signal. The excited annihilator and the photoinitiator are capable of implementing a mechanism for transfer of energy between the annihilator and the photoinitiator in order to produce an excited photoinitiator capable of generating at least one polymerization initiator capable of causing a polymerization reaction of the resin. The mechanism for transfer of energy between the annihilator and the photoinitiator can, for example, be by emission/absorption of a secondary signal, the photon energy of which is greater than the photon energy of the excitation signal, or by resonant energy transfer.

According to an alternative form, the annihilator can also be the photoinitiator and can, if need be, directly generate a polymerization initiator after having been excited.

The present disclosure thus provides a composition particularly sensitive to external irradiances, which composition is suitable for being polymerized by the implementation of an effective STTA-UC mechanism with irradiances of the order of the irradiance of the sun, that is to say of the order of 0.1 W/cm$^2$, thus much lower than the irradiances necessary with the known prior techniques. Furthermore, the STTA-UC mechanism, the efficiency of which is nonlinear in irradiance, makes it possible to obtain a confined photopolymerization in controlled three-dimensional irradiation zones and with continuous light sources.

The photosensitizer (PS) comprises at least one molecule capable of changing from a singlet state to a triplet state when it absorbs the photon energy of the external excitation signal.

The annihilator (AN) comprises molecules capable of:
- changing from a singlet state to a triplet state when they receive an energy during an interaction (or encounter) with a molecule of the photosensitizer in the triplet state, and
- changing from a triplet state to a 2-photon singlet state during a collision between molecules of annihilator, and
- employing an energy transfer mechanism in order to excite the photoinitiator for polymerization for the resin.

According to one embodiment, the photopolymerizable resin can comprise monomers, oligomers or polymers that can be polymerized by the radical route or by addition or crosslinking mechanisms, such as:
- acrylated monomers, such as acrylates, polyacrylates or methacrylates, for example a pentaerythritol triacrylate, a polyethylene glycol diacrylate or an acrylate such as Aronix D-800 sold by Taogosei Ltd., or
- acrylated oligomers, such as unsaturated amides, or
- methacrylated polymers, polymers which have a hydrocarbyl backbone and pendant peptide groups with a functionality which can be polymerized by free radicals, or
- vinyl compounds, such as styrenes, diallyl phthalate, divinyl succinate, divinyl adipate and divinyl phthalate, or
- mixtures of several of the above monomers, oligomers or polymers.

According to another embodiment, the resin can comprise cationically polymerizable monomers and oligomers and cationically crosslinkable polymers, for example epoxy resins, such as monomeric epoxides and polymeric epoxides having one or more epoxy groups, vinyl ethers, cyanate esters, and the like, and mixtures of several of these compounds.

The photosensitizer, the annihilator and a photoinitiator, as well as the mechanism employed for the polymerization, will be described in detail later.

The composition according to the present disclosure can also comprise an antioxidant. According to an alternative form, the photosensitizer, the annihilator and/or the photoinitiator can have antioxidant properties. An antioxidant makes it possible to limit the harmful effect of the oxygen dissolved in the composition. This is because the molecular oxygen dissolved in the resin very rapidly deactivates the molecules in the triplet state ("3PS", "3AN*" and "3PI*") and reduces their lifetime. Consequently, the presence of molecular oxygen in the resin can decrease the efficiency of triplet-triplet energy transfer and the triplet-triplet annihilation; finally, it can prevent the photoinitiation or reduce its efficiency. Furthermore, this deactivation often induces the formation of singlet oxygen that can react with the components of the composition and detrimentally affect their function. It is known that singlet oxygen reacts rapidly with polycyclic aromatic hydrocarbons, for example anthracene (in the example, DPA), rubrene or pyrene, and with isobenzofuran derivatives that are capable of being used as annihilators AN in the compositions in the context of the present disclosure. The composition can contain one or more chemical additives with antioxidant properties. In an alternative form, methods can be used to reduce the inhibiting effects of molecular oxygen, by reducing the concentration of molecular oxygen before or/and during irradiation by the external light source, as will be seen more fully below.

The present disclosure also relates to a method for the photopolymerization of a composition according to the present disclosure, which composition comprises a polymerizable resin, a photosensitizer, an annihilator and a photoinitiator, during which method:
- the photosensitizer absorbs a light signal received in a first range of wavelengths, and transfers the energy received from the light signal to the annihilator,
- excited by the energy received from the photosensitizer, the annihilator emits a light signal in a second range of wavelengths different from the first range of wavelengths, a photon energy of the light signal emitted by the annihilator being greater than a photon energy of the light signal received by the photosensitizer,
- the annihilator transfers energy to the photoinitiator in order to excite the photoinitiator for polymerization of the resin,
- the photoinitiator excited by the annihilator generates at least one polymerization initiator, and
- the polymerization initiator causes a polymerization reaction of the resin.

The present disclosure also relates to a material obtained by a method for the photopolymerization, as described above, of a composition according to the present disclosure, notably but not exclusively a material exhibiting the shape of an object as a thin layer, such as a film, or three-dimensional volume object. The material obtained is homogeneous.

The present disclosure also relates to a three-dimensional printing method, comprising a stage of transformation of a volume of composition according to the present disclosure by irradiation of the volume.

By virtue of the use of the STTA-UC mechanism, the volume of composition according to the present disclosure to be photopolymerized can be irradiated by an excitation source emitting an external excitation light signal with a power of less than 1000 $W/cm^2$, preferably of less than 1 $W/cm^2$ and more preferentially still of less than 0.1 $W/cm^2$, over the first range of wavelengths. Such a power, much lower than the powers essential for the implementation of the existing techniques, makes it possible to envision the development of 3D printing techniques on an industrial scale.

Within the context of the present disclosure, the irradiation can, for example, be carried out by a three-dimensional photolithography technique, a three-dimensional holographic projection technique or a "direct laser writing" (or "3D direct laser writing") technique.

The method according to the present disclosure can also comprise an initialization stage during which oxygen molecules contained in the composition are eliminated. Also, the irradiation of the volume of composition can be carried out under a flow of inert gas, for example argon, nitrogen or carbon dioxide. This makes it possible to eliminate the inhibiting effects of oxygen.

Finally, the present disclosure relates to a use of a composition according to the present disclosure in a three-dimensional printing device comprising a tank containing the composition and an external excitation light source capable of emitting a light signal in the first range of wavelengths and arranged in order to irradiate a predefined volume of composition inside the tank, the irradiated volume having a thickness preferably of less than 1 cm.

According to one embodiment, suitable for the polymerization of liquid compositions, the optical excitation source comprises an optical system suited to being immersed and moved in the liquid composition. This makes it possible notably to polymerize a composition thickness of greater than 1 cm.

DETAILED DESCRIPTION

As stated above, the present disclosure relates to a photopolymerizable composition comprising at least a photopolymerizable resin, a triplet photosensitizer PS, a triplet annihilator AN, and a polymerization photoinitiator PI. The present disclosure also relates to various procedures and additives suitable for reducing the inhibiting effect of molecular oxygen and thus improving the efficiency of the polymerization process.

Composition Example No 1

By way of nonlimiting example, conclusive tests have made it possible to photopolymerize, with an external excitation signal emitted by a laser source at 532 nm with an emission power of the order of only 150 $mW/cm^2$, a composition according to the present disclosure comprising:
- as polymerizable resin, a monomer of the acrylic acid ester type, more specifically an Aronix D-800 resin (Toagosei Co. Ltd),
- as photosensitizer PS, a porphyrin, more specifically a platinum octaethylporphyrin, commonly called PtOEP,
- as annihilator AN, a derivative of anthracene, more specifically a 9,10-diphenylanthracene, commonly abbreviated to DPA, and
- as photoinitiator PI, camphorquinone, commonly abbreviated to CQ.

For this specific example, the concentrations of the various components were chosen, on the one hand, to make possible penetration over at least one millimeter of the composition of at least 50% of the energy of the excitation signal and, on the other hand, to obtain the implementation of an STTA-UC mechanism with a quantum yield effective for the polymerization.

The STTA-UC mechanism as well as other concrete examples of composition according to the present disclosure will be described in detail below.

The PtOEP photosensitizer has an absorption spectrum with a peak at 536 nm; it has a molar absorption coefficient (also called molar extinction coefficient or molar absorptivity) of $6.52 \times 10^4$ $l \cdot mol^{-1} \cdot cm^{-1}$ at the wavelength 536 nm and $4.17 \times 10^4$ $l \cdot mol^{-1} \cdot cm^{-1}$ at the wavelength of 532 nm (i.e., at 532 nm, a relative molar absorption coefficient equal to 64% of the maximum molar coefficient (=100% at 536 nm). In this example, the first range of wavelengths can be between 520 nm and 550 nm, the limits of which are on either side of the central wavelength of the absorption spectrum of the photosensitizer. In the example employed, a concentration of 0.14 mM=0.14 $mmol \cdot l^{-1}$ was used, which corresponds to a relative molar absorption coefficient of 44% on crossing 1 mm of resin. On the other hand, PtOEP is much more transparent between 405 nm and 500 nm; this is because the transmission due to PtOEP of concentration 0.14 mmol·l$^{-1}$ is greater than 90% between 405 nm and 500 nm on crossing 1 mm of composition; its molar extinction coefficient is approximately 4×10$^3$ l·mol$^{-1}$·cm$^{-1}$, which corresponds to a relative molar absorption coefficient of 5% under the same conditions.

The DPA annihilator does not absorb at the emission wavelengths of PtOEP, nor at the wavelength 532 nm. On the other hand, DPA emits effectively at the absorption wavelength of the CQ photoinitiator between 400 nm and 500 nm (second range of wavelengths): experience thus shows that the light power emitted by DPA at 440 nm is a function of the square of the light power of the excitation source, which is characteristic of a high-energy emission following the absorption of two photons by the STTA-UC mechanism. In the example employed, a concentration of 6 mM of DPA was used, i.e. a concentration 60 times greater than the concentration of PtOEP photosensitizer. In addition, DPA is also an antioxidant, which helps in reducing the limiting effects of molecular oxygen dissolved in the resin.

The photoinitiator PI used, camphorquinone, is a photoinitiator that produces free radicals capable of triggering a polymerization chain reaction. The CQ photoinitiator does not absorb green light at 532 nm but absorbs in the blue between 400 nm and 500 nm (second range of wavelengths) and thus absorbs the photons emitted by the annihilator AN. In the example employed, a concentration of 0.5 mM of PI was used.

Finally, the resin chosen is photopolymerizable by a mechanism of the radical type and is capable of reacting with the photoinitiator.

For the above homogeneous composition, the initiation of the photopolymerization induced by STTA-UC takes place in the following way. A light source (excitation source external to the composition) illuminates the part of the composition to be polymerized by an excitation signal emitting over a first range of wavelengths corresponding to the absorption of the PS molecules. In the examples employed, a green laser emitting at 532 nm was used. Only the PS molecules (in the example PtOEP) absorb the photons at 532 nm and mainly form the triplet states "3PS*". Many molecules of annihilator AN (in the example DPA) surround the PS molecules so that, during collisions between "3PS*" and AN, the excitation energy of the "3PS*" molecules is transferred to the AN molecules, which become excited into triplet states "3AN*". Then, during collisions between two molecules of annihilator in the "3AN*" state, there is annihilation of the excited triplet states and addition of the energy of two "3AN*" states in one of the two molecules of annihilator, which then becomes excited with the energy of approximately two triplet states (two photons) into the singlet state "1AN*", with an energy greater than the photon energy of the excitation signal. These "1AN*" molecules then transfer their energies to the molecules of the photoinitiator PI (in the example CQ). This energy transfer can be carried out either by a nonradiative mechanism or by the emission of a secondary signal in a second range of wavelengths (400 nm to 500 nm in the examples) different from the first range of wavelengths. The photoinitiators PI then generate "R*" radicals after conversion into their triplet states "3PI*". Finally, these "R*" radicals cause the radical polymerization reaction of the monomers that constitute the base of the resin.

The above example was implemented and a polymerization was initiated with a continuous laser excitation source at 532 nm from a light irradiance of 150 mW/cm$^2$, which is thus much lower than the irradiances usually necessary for a conventional two-photon reaction, as mentioned above. Measurements have demonstrated a quadratic relationship between the mean light power of the excitation signal provided by the source, the external laser excitation annihilator, and the mean light power of the secondary signal emitted by fluorescence by the annihilator after the transfer of energy from the photosensitizer to the annihilator and the annihilation of the triplet states of the molecules of the annihilator. In the composition, the polymerization is limited to three-dimensional zones in which the irradiance of the excitation source has created enough radicals by the STTA-UC mechanism. In a concrete implementation, the excitation signal was focused in a layer of composition according to the present disclosure with a thickness of one millimeter by a microscope lens in order to create a polymerization voxel of submicron size. The continuous displacement of the focal point during the light excitation made it possible to manufacture polymerization lines inside the composition.

In another concrete implementation, the front face of a 3D hologram of the edges of a cube with a side length of 8 mm was projected into a tank of composition with a thickness of approximately 1 mm; the polymerization of the resin made it possible to obtain a solid reproduction of this 3D image.

The polymerization of a resin-based composition according to the present disclosure has just been described above in the context of a specific composition example. Nevertheless, the present disclosure cannot be reduced to this specific example, and other photosensitizers, other annihilators and other photoinitiators can be chosen, notably according to the resin chosen and the external light source chosen. Other means for limiting the inhibiting effect of oxygen can also be employed.

Preparation Example No. 2

The nonlinear polymerization initiated by the STTA-UC mechanism was obtained in a second practical example of a homogeneous composition according to the present disclosure comprising:
- as polymerizable resin, a monomer of acrylate type, more specifically pentaerythritol triacrylate,
- as photosensitizer PS, a porphyrin, more specifically a platinum octaethylporphyrin, commonly called PtOEP,
- as annihilator AN, a derivative of anthracene, more specifically a 9,10-diphenylanthracene, commonly abbreviated to DPA, and
- as photoinitiator PI, phenylbis(2,4,6-trimethylbenzoyl) phosphine oxide, commonly abbreviated to BAPO.

The PtOEP concentration was 8 μmol·l$^{-1}$, i.e. approximately 17 times lower than in example No. 1, making possible a transmission of approximately 70% on crossing 1 cm of resin at 532 nm, i.e. at the wavelength of the external excitation source.

The DPA concentration was 0.22 mmol·l$^{-1}$, i.e. 27 times lower than the concentration in example No. 1 and 27 times higher than that of the PtOEP.

The photoinitiator, BAPO, is capable of initiating the radical polymerization. This photoinitiator PI does not absorb light at the wavelength of the external excitation source (at 532 nm, within the first range of wavelengths 520 nm to 550 nm) but absorbs in the spectral range 400 nm to 500 nm (second range of wavelengths) in order to absorb the secondary signal emitted by the annihilator. The concentration of the PI was 32 mmol·l$^{-1}$ in this example.

In order to decrease the oxygen contained in the resin-based composition, the composition was sparged with an inert gas, argon (Ar), before the polymerization. The composition was subsequently placed in a culture chamber slide system (LAB-TEK™) under a continuous flow of argon in order to decrease the rediffusion of oxygen into the composition. The polymerization was carried out under microfabrication conditions in an inverted microscope. The intensity of the external excitation source at 532 nm was 100 mW/cm$^2$.

Preparation Example No. 3

In a third practical example, the polymerization was carried out in a transparent tank with an internal volume of 10×10×40 mm (width×depth×height). The composition according to the present disclosure comprised:
- as polymerizable resin, a monomer of acrylate type, more specifically poly(ethylene glycol) diacrylate,
- as photosensitizer PS, a porphyrin, more specifically a platinum octaethylporphyrin, commonly called PtOEP,
- as annihilator AN, a derivative of anthracene, more specifically a 9,10-diphenylanthracene, commonly abbreviated to DPA, and
- as photoinitiator PI, phenylbis(2,4,6-trimethylbenzoyl) phosphine oxide, commonly abbreviated to BAPO.

The PtOEP concentration this time was 7 µmol·l$^{-1}$, i.e. 20 times lower than in example No. 1, the resin transmission is 51% on crossing 1 cm of resin at the wavelength of the external excitation source of wavelength 532 nm included in this example in a first range of wavelengths 520 nm to 550 nm.

The DPA concentration was 0.22 mmol·l$^{-1}$, i.e. 27 times lower than the concentration in example No. 1.

The photoinitiator, BAPO, does not absorb at the irradiation wavelength (532 nm) but absorbs in the spectral range 400 nm to 450 nm (second range of wavelengths in this example) in order to absorb the secondary signal emitted by the annihilator. The concentration of the PI was 30 mmol·l$^{-1}$ in the example.

The resin was sparged with an inert gas, this time nitrogen (N$_2$), in order to decrease its oxygen content before the polymerization. Subsequently, the tank was sealed in order to prevent the return of oxygen into the resin. The resin was exposed to an external irradiation source emitting at 532 nm with the irradiance of approximately 50 mW·cm$^{-2}$ in order to trigger the polymerization.

Choice of the Photosensitizer

The photosensitizer is chosen from the photosensitizers exhibiting at least one of the following properties. The best results are obtained for the photosensitizers exhibiting all of the following properties.

The photosensitizer PS must absorb the external excitation signal in order to make maximum use of the energy of the external light source emitted over the first range of wavelengths in order to generate the triplet states "1PS*". It must also be as transparent as possible to the light radiation (secondary signal) emitted by the annihilator over the second range of wavelengths in order for the energy of the secondary signal to be available to the photoinitiator. For these reasons, a photosensitizer PS will be chosen comprising at least one molecule, a molar absorption coefficient of which over the first range of wavelengths is greater than at least twice, and preferably at least ten times, a molar absorption coefficient of the molecule over the second range of wavelengths. In the preceding example, PtOEP has a molar absorption coefficient (also called molar extinction coefficient or molar absorptivity) ε=4×10$^3$ l·mol$^{-1}$·cm$^{-1}$ over the second range of 400 nm to 500 nm and a molar coefficient ε=4.17×10$^4$ l·mol$^{-1}$·cm$^{-1}$ for a wavelength of 532 nm, i.e. ten times higher than the value of the molar coefficient at 400 nm to 500 nm. The PtOEP thus absorbs the external excitation signal ten times more than the secondary signal emitted by the annihilator.

In the examples employed, a photosensitizer comprising just one molecule, PtOEP, was used. However, it is also possible to use a photosensitizer comprising several types of photosensitizer molecules, each photosensitizer molecule exhibiting, over at least a part of the first range of wavelengths, a molar absorption coefficient greater than at least twice, and preferably at least ten times, the molar absorption coefficient of the same photosensitizer molecule over at least a part of the second range of wavelengths. The choice is thus made of molecules having related absorption spectra, exhibiting a large absorption coefficient over neighboring parts of the first range of wavelengths, so that it is possible to illuminate the composition with an excitation source having a broader, more diffuse, emission spectrum, of the same limited power, while having an energy maximum of the excitation signal absorbed by one or the other of the different molecules of the photosensitizer.

A composition according to the present disclosure is more or less liquid, more or less viscous, indeed even solid, and, in order to be used, it is stored in a tank with a shape appropriate to the desired use or deposited on a substrate. In order for the composition to be able to be polymerized over a thickness d, the external excitation signal must be able to penetrate into the composition over the thickness d with sufficient energy. For this purpose, a concentration of photosensitizer CPS is chosen that is less than CPSmax=–log$_{10}$(0.3)/(ε*d) and preferably less than CPSmax=–log$_{10}$(0.7)/(ε*d), over the first range of wavelengths, where ε is the molar extinction coefficient (also called molar absorptivity or molar absorption coefficient) of the photosensitizer and d is the thickness of the composition to be photopolymerized. With such a concentration, 30% and preferably 70% of the energy of the excitation signal penetrates at least up to a thickness d inside the composition. In the example of PtOEP, preferably CPSmax=3.7 µmol·l$^{-1}$ for d=1 cm, PtOEP having a molar extinction coefficient equal to ε=4.17×10$^4$ l·mol$^{-1}$·cm$^{-1}$. If necessary, the optical system can also be immersed in the liquid composition to be polymerized, in order to manufacture objects having a thickness of greater than d.

In addition, the molecule of the photosensitizer must have a quantum yield of triplet state generation of greater than 0.1 and preferably of greater than 0.5. By way of example, that of PtOEP is 0.5 in a polystyrene matrix and close to unity in solution.

Also, the photosensitizer molecule is chosen in order to have a lifetime in the triplet state of greater than 10 µs. This makes it possible to have efficient energy transfer by diffusion and collision with the annihilator AN molecules. By way of example, PtOEP in the triplet state has a lifetime of 91 µs in a polystyrene matrix and of 50 µs in a deoxygenated solvent.

The molecule of the photosensitizer PS is chosen so that an energy level of the molecule of the photosensitizer in the triplet state "3PS*" is greater than an energy level of the annihilator molecule in the triplet state "3AN*" and so that an energy level of the molecule of the photosensitizer in the singlet state "1PS*" is lower than an energy level of the molecule of the annihilator in the singlet state "1AN*". This makes it possible to obtain an efficient energy transfer from the triplet state "3PS*" to the triplet state "3AN*" and to limit, indeed even prohibit, an energy transfer from the singlet state "1AN*" to the singlet state "1PS*".

Mention may notably be made, among the molecules of photosensitizer PS capable of being used in the context of the present disclosure, of:
- metalloporphyrins, for example a platinum octaethylporphyrin (PtOEP), a palladium octaethylporphyrin (PdOEP), a palladium tetratolylporphyrin (PdTPP), a platinum (II) tetraphenyltetrabenzoporphyrin (PtTPBP), palladium 2-methyl-9,10-dinaphthylanthracene (PdMeTPP), a palladium meso-tetraphenyltetrabenzoporphyrin 1 (PdPh$_4$TBP) or a 1,4,8,11,15,18,22,25-octabutoxyphthalocyanine (PdPc(OBu)$_8$),
- the molecule Ir(ppy)$_3$, with ppy a 2-phenylpyridine,
- molecules comprising a Ru(dmb)$_3$- or Ru-polypyridyl- radical, for example the molecule Ru(dmb)$_3$-An, with dmb a 4,4'-dimethyl-2,2'-bipyridine and An anthracene,
- the molecule 2,3-butanedione (or diacetyl), or
- a combination of several of the above molecules.

These molecules are capable of being excited, depending on the molecule, with a source emitting at a wavelength in the visible or near infrared, for example at the wavelengths of 450 nm, 532 nm, 635 nm or 725 nm, depending on the molecules. Other molecules might be optimized for other wavelengths in the near UV, the visible or the near infrared.

Choice of the Annihilator

The annihilator AN is chosen from annihilators exhibiting at least one of the following properties, the best results in the context of the present disclosure being obtained for annihilators exhibiting all of the following properties.

The annihilator AN must for its part be as transparent as possible to the external excitation signal so that under no circumstances does the annihilator alone emit more than 10% of the photons, and preferably more than 1% of the photons, emitted by the STTA-UC mechanism in the presence of the photosensitizer PS. The annihilator (AN) exhibits a relative molar absorption coefficient over the first range of wavelengths of less than 20% and preferably of less than 10%.

Preferably, a molar concentration of the annihilator AN is greater than at least 10 times and preferably at least 30 times the molar concentration of the photosensitizer. This makes it possible to obtain a good transfer of energy between the triplet state "3PS*" and the triplet state "3AN*".

Preferably, the annihilator AN must have an emission quantum yield of greater than 10% and preferably greater than 50%. For example, DPA has a fluorescence yield of 0.9 in a cyclohexane solution.

Also, the molecule of the annihilator AN is chosen in order to have a lifetime in the triplet state of greater than 10 μs. This makes it possible to have a sufficient probability of collision between two "3AN*" molecules to have effective annihilation between two "3AN*" molecules in order to obtain a "1AN" molecule in the two-photon excited singlet state.

More preferably, the molecule AN is chosen in order to have an energy level in the singlet state "1AN*" that is less than twice its energy level in the triplet state "3AN*". This facilitates the annihilation between two "3AN*" molecules in order to obtain a "1AN" molecule in the two-photon excited singlet state.

In the examples described above, an annihilator comprising just one molecule, for example DPA, was used. However, it is also possible to use an annihilator comprising a plurality of molecules, a relative molar absorption coefficient of each molecule of the annihilator being less than 20% and preferably less than 10% over at least a part of the first range of wavelengths. AN molecules that are as transparent as possible to the external excitation signal are thus chosen, so that the energy transmitted by the external excitation signal is absorbed essentially by the photosensitizer and not by the annihilator. Using several molecules of annihilator AN makes it possible to have a sufficient probability of collision between two "3AN*" molecules to have effective triplet-triplet annihilation by diffusion and collision between two "3AN*" molecules in order to obtain a "1AN" molecule in the two-photon excited singlet state.

Mention may notably be made, among the molecules of annihilator AN capable of being used in the context of the present disclosure, of:
- an anthracene derivative, for example anthracene (An), 9,10-diphenylanthracene (DPA), 9,10-dimethylanthracene (DMA), 9,10-di(p-tolyl)anthracene (DTA), 2-chloro-9,10-di(p-tolyl)anthracene (DTACl), 9,10-di(p-tolyl)anthracene-2-carbonitrile (DTACN), 9,10-dinaphthylanthracene-2-carbonitrile (DNACN), 2-methyl-9,10-dinaphthylanthracene (DNAMe), 2-chloro-9,10-dinaphthylanthracene (DNACl), 9,10-bis(phenylethynyl)anthracene (BPEA), 2-chloro-9,10-bis(phenylethynyl)anthracene (2CBPEA), 5,6,11,12-tetraphenylnaphthacene (rubrene), pyrene or perylene,
- an anthracene derivative and an isobenzofuran derivative, for example 1,3-diphenylisobenzofuran (DPBF),
- the 2,5-diphenyloxazole (PPO) molecule.

These molecules are capable of emitting a secondary signal, an emission peak of which is centered, depending on the molecule, on the following wavelengths: 380 nm to 400 nm, 435 nm to 440 nm, 446 nm to 464 nm, 470 nm to 475 nm, 550 nm to 600 nm, and the like.

Choice of a Photosensitizer/Annihilator Pair

Furthermore, preferably, good compatibility between photosensitizer and annihilator can be obtained with a photosensitizer/annihilator pair among the following pairs:
- a compound comprising a ruthenium(polypyridyl)$_3$-(Ru (dmb)$_3$-) radical, with dmb a 4,4'-dimethyl-2,2'-bipyridine, for example the compound ruthenium(polypyridyl)$_3$-anthracene combined with 9,10-diphenylanthracene (DPA),
- a compound Ir(ppy)$_3$, where ppy is a 2-phenylpyridine, combined with pyrene,
- a palladium meso-tetraphenyltetrabenzoporphyrin 1 (PdPh$_4$TBP) combined with 5,6,11,12-tetraphenylnaphthacene (rubrene),
- a 1,4,8,11,15,18,22,25-octabutoxyphthalocyanine (PdPc (OBu)$_8$) combined with 5,6,11,12-tetraphenylnaphthacene (rubrene),
- a palladium tetraanthraporphyrin (PdTAP) combined with 5,6,11,12-tetraphenylnaphthacene (rubrene),
- a platinum octaethylporphyrin (PtOEP) combined with 9,10-diphenylanthracene (DPA),
- a palladium meso-tetratolylporphyrin (PdTPP) combined with 9,10-diphenylanthracene (DPA),
- a palladium tetrabromophenylporphyrin (PdBrTPP) combined with 9,10-diphenylanthracene (DPA),
- a palladium tetramethylphenylporphyrin (PdMeTPP) combined with a 9,10-dinaphthylanthracene, for example 9,10-dinaphthylanthracene-2-carbonitrile (DNACN), 2-methyl-9,10-dinaphthylanthracene (DNAMe) or 2-chloro-9,10-dinaphthylanthracene (DNACl),
- a platinum(II) tetraphenyltetrabenzoporphyrin (PtTPBP) combined with perylene, with 9,10-bis(phenylethynyl) anthracene (BPEA), a molecule 2,3-butanedione (diacetyl) combined with 2,5-diphenyloxazole (PPO).

By way of example, the photosensitizer Ir(ppy)$_8$ is capable of effectively absorbing a light signal having a wavelength within the first range of 440 nm to 460 nm (blue light signal), around the wavelength 450 nm, which corresponds to an absorption peak for the compound Ir(ppy)$_8$. Pyrene, an annihilator, is capable for its part of emitting a light signal in the second range of 380 nm to 400 nm (ultraviolet), around the wavelength 390 nm, which corresponds to an emission peak for pyrene. The Ir(ppy)$_3$/pyrene pair is capable of effectively implementing an STTA-UC mechanism.

In another example, the photosensitizer PdPc(OBu)$_8$ is capable of effectively absorbing a light signal having a wavelength within the first range of 710 nm to 730 nm (red light), around the wavelength 725 nm, which corresponds to an absorption peak for the compound PdPc(OBu)$_3$. Rubrene, an annihilator, is capable for its part of emitting a light signal in the second range of 550 nm to 600 nm (yellow light signal), around the wavelength 560 nm, which corresponds to an emission peak for rubrene. The PdPc(OBu)$_8$/rubrene pair is capable of effectively implementing an STTA-UC mechanism.

The first range and the second range of wavelengths can thus vary from one photosensitizer/annihilator pair to the other, the important thing being, within the context of the present disclosure, that the two ranges of wavelengths are distinct.

Choice of the Photoinitiator

The photoinitiator PI for its part must not absorb the external excitation light signal in order for a greater part of the energy of this signal to be able to be absorbed by the photosensitizer. On the other hand, the photoinitiator must absorb as well as possible the energy of the secondary signal emitted by the annihilator. For this, the absorption spectrum of the photoinitiator must significantly (at least 80%) overlap the fluorescence emission spectrum of the annihilator in the singlet state. Thus, in the examples described above, camphorquinone (CQ) and BAPO absorb well the secondary signal emitted by the annihilator over the 400 nm to 500 nm range.

The photoinitiator must also be suited to the resin to be polymerized. Thus, in the example described above, camphorquinone (CQ) and BAPO generate free radicals capable of initiating the polymerization of the chosen resin of acrylate type, more specifically pentaerythritol triacrylate or poly(ethylene glycol) diacrylate. However, other photoinitiators can be used, for example a photoinitiator capable of generating, as the case may be, acids or bases capable of initiating the ionic polymerization of certain resins. In an alternative form, the photoinitiator can be combined with other co-initiating molecules, such as camphorquinone when the latter is combined with tertiary amines.

More preferably, the photoinitiator molecule is chosen in order to have an energy level in the triplet state "3PI*" that is greater than the energy level in the triplet state "3PS*" of the photosensitizer and greater than the energy level in the triplet state "3AN*" of the annihilator. This makes it possible to avoid a possible unwanted reaction between the "3PI*" molecule and the "3PS*" molecule or between the "3PI*" molecule and the "3AN*" molecule. By way of example, camphorquinone has an energy level in the triplet state of the order of 2.2 eV, i.e. at least 0.3 eV more than PtOEP (the energy level in the triplet state of which is of the order of 1.9 eV) and than DPA (the energy level in the triplet state of which is of the order of 1.77 eV). As another example, bis(acyl)phosphine oxide (BAPO) has an energy level in the triplet state of the order of 2.6 eV, i.e. at least 0.5 eV more than PtOEP or DPA. In another alternative form, the same molecule can be used for the annihilator and the photoinitiator.

Solutions for Reducing the Effects of the Oxygen Present in the Composition According to the Present Disclosure The methods for reducing the concentration of molecular oxygen in the composition according to the present disclosure are notably:

the degassing of the resin under vacuum by freeze/thaw cycles, the sparging of an inert gas, for example argon (Ar), nitrogen ($N_2$), carbon dioxide ($CO_2$) or the like through the resin, the addition to the composition of a strong reducing agent in high concentration which reacts with oxygen, for example various sulfites.

On using the methods described above, it is preferable for the tank containing the polymerizable resin to be sealed or for the resin to be polymerized under an inert atmosphere due to the return of oxygen by diffusion.

The first two methods consist of a stage of elimination of the oxygen present in the composition, an initialization stage carried out before a stage of polymerization of the composition.

The third method consists in adding an antioxidant to the composition according to the present disclosure. One or more types of molecules of antioxidants can be chosen that react with the singlet oxygen resulting from the deactivation of the triplet states of PS, AN and PI by molecular oxygen. The antioxidant molecule and its concentration are chosen in order for the singlet oxygen to react preferentially with the antioxidant. At the start of the exposure of the composition to the external excitation signal, the antioxidant reduces the concentration of singlet oxygen and, consequently, the concentration of molecular oxygen dissolved in the resin also decreases. As soon as the oxygen concentration is sufficiently reduced for its interaction with the triplet states of the components (3PS*, 3AN* and 3PI*) to be negligible, the STTA-UC phenomenon and the polymerization are triggered. The use of the antioxidant in the formulation induces a delay time (induction time) in the polymerization.

The antioxidants can have several functions; more specifically, they can be both antioxidants and annihilators, antioxidants and photoinitiators, antioxidants and photosensitizers or antioxidants and polymerizable monomers. Notably, the derivatives of anthracene, pyrene or rubrene are capable of being used in the composition as both annihilators and antioxidants.

The antioxidant is chosen so that it absorbs at least 5 times less than the other compounds in the first and in the second ranges of wavelengths, with the exception of the antioxidants that have multiple functions. In other words, the antioxidant is chosen so that its molar absorption coefficient is at least five times lower than the molar absorption coefficient of the photosensitizer (PS), than the molar absorption coefficient of the annihilator (AN) and than the photoinitiator (PI) molar absorption coefficient over the first range of wavelengths and over the second range of wavelengths.

Preferably, the antioxidant is chosen in order for it not to react either with the photosensitizers, annihilators and photoinitiators or with these components in their triplet and singlet states. The antioxidants capable of being used in a composition according to the present are notably:

polycyclic aromatic hydrocarbon derivatives, for example anthracene, pyrene, rubrene or naphthalene, isobenzofuran derivatives, such as 1,3-diphenylisobenzofuran, furan derivatives, such as, for example, 2,5-dimethylfuran, unsaturated carboxylic acids, for example oleic acid, tertiary amines and their derivatives, such as, for example, N-methyldiethanolamine (MDEA) or triethylamine (TEA), sulfites.

Choice of the Polymerizable Resin

Finally, the resin used in the context of the present disclosure can be any photopolymerizable resin, whatever the mechanism to be implemented in order to trigger the polymerization (radical mechanism, ionic mechanism, and the like). The choice will subsequently be made, in the context of the present disclosure, of a photoinitiator appropriate to the mechanism to be implemented in order to initiate the polymerization and more specifically appropriate to the resin to be polymerized, then the choice will be made of a photosensitizer/annihilator pair compatible with the photoinitiator and capable of implementing an STTA-UC mechanism.

The resins capable of being used comprise, for example:
monomers, oligomers or polymers that can be polymerized by the radical route by addition or crosslinking mechanisms, such as:
  acrylated monomers, such as acrylates, polyacrylates or methacrylates, or
  acrylated oligomers, such as unsaturated amides, or
  methacrylated polymers, polymers that have a hydrocarbyl backbone and pendant peptide groups with a functionality which can be polymerized by free radicals, or
  vinyl compounds, such as styrenes, diallyl phthalate, divinyl succinate, divinyl adipate and divinyl phthalate, or
  mixtures of several of the above monomers, oligomers or polymers,
cationically polymerizable monomers and oligomers and cationically crosslinkable polymers, for example epoxy resins, such as monomeric epoxides and polymeric epoxides having one or more epoxy groups, vinyl ethers, cyanate esters, and the like, and mixtures of several of these compounds.

The invention claimed is:

1. A photopolymerizable composition comprising:
a polymerizable resin,
a photosensitizer (PS),
an annihilator (AN), and
a photoinitiator (PI),
the photosensitizer being capable of absorbing an excitation light signal received in a first range of wavelengths, the annihilator being capable of emitting a light signal in a second range of wavelengths different from the first range of wavelengths, wherein, during the absorption of light by the photosensitizer in the first range of wavelengths, the annihilator emits the light signal in the second range of wavelengths, a photon energy of the light signal emitted by the annihilator being greater than a photon energy of the light signal received by the photosensitizer, wherein the annihilator is capable of implementing an energy transfer mechanism in order to excite the photoinitiator (PI) for polymerization of the resin, and wherein the excited photoinitiator is capable of generating at least one polymerization initiator able to cause a polymerization reaction of the resin.

2. The photopolymerizable composition of claim 1, wherein:
the photosensitizer (PS) and the annihilator (AN) are capable of implementing together a reaction for absorption, by the photosensitizer (PS), of two photons of the excitation light signal received, followed by a reaction for an additive conversion of energy by annihilation of triplets (STTA-UC) in order to obtain an excited annihilator (1AN*), a photon energy of which in the second range of wavelengths is greater than the photon energy of the excitation signal in the first range of wavelengths, and
the excited annihilator (1AN*) and the photoinitiator (PI) being capable of implementing a mechanism for transfer of energy between the annihilator and the photoinitiator in order to produce an excited photoinitiator (3PI*) capable of generating at least one polymerization initiator able to cause a polymerization reaction of the resin.

3. The photopolymerizable composition of claim 1, wherein the photosensitizer (PS) comprises at least one molecule capable of changing from a singlet state (1PS*) to a triplet state (3PS*) when it absorbs the photon energy of the excitation light signal.

4. The photopolymerizable composition of claim 3, wherein the annihilator (AN) comprises molecules capable of:
changing from a singlet state (1AN*) to a triplet state (3AN*) when they receive an energy during an interaction with a molecule of the photosensitizer in the triplet state (3PS*), and
changing from a triplet state (3AN*) to a 2-photon singlet state (1AN*) during a collision between molecules of annihilator, and
employing an energy transfer mechanism in order to excite the photoinitiator (PI) for polymerization of the resin.

5. The photopolymerizable composition of claim 1, wherein the polymerizable resin comprises:
monomers, oligomers or polymers which can be polymerized by a radical route by addition or crosslinking mechanisms, such as:
  acrylated monomers, such as acrylates, polyacrylates or methacrylates, or
  acrylated oligomers, such as unsaturated amides, or
  methacrylated polymers, polymers which have a hydrocarbyl backbone and pendant peptide groups with a functionality which can be polymerized by free radicals, or
  vinyl compounds, such as styrenes, diallyl phthalate, divinyl succinate, divinyl adipate and divinyl phthalate, or
  mixtures of several of the above monomers, oligomers or polymers,
cationically polymerizable monomers and oligomers and cationically crosslinkable polymers, for example epoxy resins, such as monomeric epoxides and polymeric epoxides having one or more epoxy groups, vinyl ethers, cyanate esters, and the like, and mixtures of several of these compounds.

6. The photopolymerizable composition of claim 1, wherein the photosensitizer is chosen from photosensitizers exhibiting at least one of the following properties:
the photosensitizer comprises at least one molecule, a molar absorption coefficient of which over the first range of wavelengths is greater than at least twice, and preferably at least ten times, a molar absorption coefficient of the molecule over the second range of wavelengths, the photosensitizer comprises a plurality of photosensitizer molecules, each photosensitizer molecule exhibiting, over at least a part of the first range of wavelengths, a molar absorption coefficient greater than at least twice, and preferably at least ten times, the molar absorption coefficient of the same photosensitizer molecule over at least a part of the second range of wavelengths, the photosensitizer exhibits a molar concentration CPS which is less than $CPSmax=-\log_{10}(0.3)/(\varepsilon \cdot d)$ over the first range of wavelengths, where $\varepsilon$ is the molar extinction coefficient of the photosensitizer and d is the thickness of the composition to be photopolymerized, and/or the photosensitizer molecule has a lifetime in a triplet state of greater than 10 μs, and/or an energy level of the photosensitizer molecule in the triplet state is greater than an energy level of a molecule of the annihilator in the triplet state, and an energy level of the photosensitizer molecule in a singlet state is lower than an energy level of the molecule of the annihilator in the singlet state.

7. The photopolymerizable composition of claim 1, wherein the photosensitizer is chosen from:

metalloporphyrins, the photosensitizer being, for example, a platinum octaethylporphyrin (PtOEP), a palladium octaethylporphyrin (PdOEP), a palladium tetratolylporphyrin (PdTPP), a platinum(II) tetraphenyltetrabenzoporphyrin (PtTPBP), palladium 2-methyl-9,10-dinaphthylanthracene (PdMeTPP), a palladium meso-tetraphenyltetrabenzoporphyrin 1 (PdPh$_4$TBP) or a 1,4,8,11,15,18,22,25-octabutoxyphthalocyanine (PdPc(OBu)$_8$), a molecule Ir(ppy)$_3$, with ppy a 2-phenylpyridine, molecules comprising a Ru(dmb)$_3$- or Ru-polypyridyl-radical, for example the molecule Ru(dmb)$_3$-An, with dmb a 4,4'-dimethyl-2,2'-bipyridine and An anthracene, the molecule 2,3-butanedione, or a combination of several of the above molecules.

8. The photopolymerizable composition of claim 1, wherein the annihilator (AN) is chosen from annihilators exhibiting at least one of the following properties:

the annihilator (AN) exhibits a relative molar absorption coefficient over the first range of wavelengths of less than 20% and preferably of less than 10%, and/or a molar concentration of the annihilator is greater than at least 10 times and preferably at least 30 times the molar concentration of the photosensitizer, and/or an energy level of a molecule of the annihilator in a singlet state is less than twice an energy level of the molecule of the annihilator in a triplet state, and/or the molecule of the annihilator has a lifetime in the triplet state of greater than 10 μs, and/or the annihilator comprises a plurality of molecules, the relative molar absorption coefficient of each molecule of the annihilator being less than 20% and preferably less than 10% over at least a part of the first range of wavelengths.

9. The photopolymerizable composition of claim 1, wherein the annihilator is chosen from:

an anthracene derivative, for example anthracene (An), 9,10-diphenylanthracene (DPA), 9,10-dimethylanthracene (DMA), 9,10-di(p-tolyl)anthracene (DTA), 2-chloro-9,10-di(p-tolyl)anthracene (DTACl), 9,10-di(p-tolyl)anthracene-2-carbonitrile (DTACN), 9,10-dinaphthylanthracene-2-carbonitrile (DNACN), 2-methyl-9,10-dinaphthylanthracene (DNAMe), 2-chloro-9,10-dinaphthylanthracene (DNACl), 9,10-bis(phenylethynyl)anthracene (BPEA), 2-chloro-9,10-bis(phenylethynyl)anthracene (2CBPEA), 5,6,11,12-tetraphenylnaphthacene (rubrene), pyrene or perylene, a combination of an anthracene derivative and of an isobenzofuran derivative, for example 1,3-diphenylisobenzofuran (DPBF), a 2,5-diphenyloxazole (PPO) molecule.

10. The photopolymerizable composition of claim 1, wherein the annihilator and the photoinitiator are identical.

11. The photopolymerizable composition of claim 1, further comprising an antioxidant.

12. The photopolymerizable composition of claim 11, wherein the photosensitizer (PS), the annihilator (AN) and/or the photoinitiator (PI) have antioxidant properties.

13. The photopolymerizable composition of claim 12, wherein a molar absorption coefficient of the antioxidant is at least five times lower than the molar absorption coefficient of the photosensitizer (PS), than the molar absorption coefficient of the annihilator (AN) and than the photoinitiator (PI) molar absorption coefficient over the first range of wavelengths and over the second range of wavelengths.

14. A method for photopolymerizing a photopolymerizable composition comprising:

a polymerizable resin,
a photosensitizer (PS),
an annihilator (AN), and
a photoinitiator (PI),
the method comprising:

the photosensitizer absorbing a light signal received in a first range of wavelengths, and transferring energy received from the light signal to the annihilator, excited by the energy received from the photosensitizer, the annihilator emitting a light signal in a second range of wavelengths different from the first range of wavelengths, a photon energy of the light signal emitted by the annihilator being greater than a photon energy of the light signal received by the photosensitizer, the annihilator transferring energy to the photoinitiator in order to excite the photoinitiator (PI) for polymerization of the resin, the photoinitiator, excited by the annihilator, generating at least one polymerization initiator, and the polymerization initiator causing a polymerization reaction of the resin.

15. A material obtained by a method of photopolymerizing a photopolymerizable composition, the photopolymerizable composition comprising a polymerizable resin, a photosensitizer (PS), an annihilator (AN), and a photoinitiator (PI), the method of photopolymerizing comprising:

the photosensitizer absorbing a light signal received in a first range of wavelengths, and transferring energy received from the light signal to the annihilator, excited by the energy received from the photosensitizer, the annihilator emitting a light signal in a second range of wavelengths different from the first range of wavelengths, a photon energy of the light signal emitted by the annihilator being greater than a photon energy of the light signal received by the photosensitizer, the annihilator transferring energy to the photoinitiator in order to excite the photoinitiator (PI) for polymerization of the resin, the photoinitiator, excited by the annihilator, generating at least one polymerization initiator, and the polymerization initiator causing a polymerization reaction of the resin.

16. The material of claim 15, wherein the material exhibits a shape of an object as a thin layer, such as a film, or three-dimensional volume object.

17. A three-dimensional printing method, comprising:
a stage of irradiating a volume of the photopolymerizable composition of claim 14; and
a stage of photopolymerizing the volume of the photopolymerizable composition according to the method of claim 14.

18. The method of claim 17, wherein irradiating the volume comprises irradiating the volume by an excitation source emitting a light signal with a power of less than 1000 W/cm², and preferably of less than 1 W/cm² over the first range of wavelengths.

19. The method of claim 17, wherein irradiating the volume comprises irradiating the volume by a three-dimensional photolithography technique, a three-dimensional holographic projection technique or a "direct laser writing" technique.

20. The method of claim 17, further comprising an initialization stage comprising eliminating oxygen molecules contained in the photopolymerizable composition.

21. The method of claim 17, wherein irradiating the volume comprises irradiating the volume under a flow of inert gas, for example argon or nitrogen.

22. The method of claim 17, further comprising using the photopolymerizable composition in a three-dimensional printing device comprising a tank containing the photopolymerizable composition and an external excitation light source arranged in order to irradiate a predefined volume of the photopolymerizable composition inside the tank, the irradiated volume having a thickness of greater than 0.5 μm and preferably of less than 1 cm.

23. The method of claim 22, wherein at least prior to the use, the photopolymerizable composition is liquid.

24. The method of claim 23, wherein using the photopolymerizable composition in the three-dimensional printing device comprising the tank containing the photopolymerizable composition and the external excitation light source comprises using the photopolymerizable composition in the three-dimensional printing device comprising the tank containing the photopolymerizable composition and an external excitation light source comprising an optical irradiation system immersed in the liquid and means for moving the optical irradiation system in the liquid.

* * * * *

UNITED STATES PATENT AND TRADEMARK OFFICE
CERTIFICATE OF CORRECTION

PATENT NO. : 11,629,203 B2
APPLICATION NO. : 16/636008
DATED : April 18, 2023
INVENTOR(S) : Patrice Baldeck and Akos Banyasz It is certified that error appears in the above-identified patent and that said Letters Patent is hereby corrected as shown below:

In the Specification

| | | |
|---|---|---|
| Column 4, | Line 60, | change "("3PS"," to --("3PS*",-- |
| Column 10, | Line 34, | change "where c is" to --where ε is-- |
| Column 11, | Lines 8-9, | change "a platinum (II)" to --a platinum(II)-- |
| Column 12, | Lines 38-39, | change "(polypyridyl)$_3$-(Ru(dmb)$_3$-)" to --(polypyridyl)$_3$-(Ru(dmb)$_3$-)-- |
| Column 13, | Line 3, | change "Ir(ppy)$_8$ is" to --Ir(ppy)$_3$ is-- |
| Column 13, | Lines 7-8, | change "(Ir(ppy)$_8$. Pyrene," to --Ir(ppy)$_3$. Pyrene,-- |
| Column 13, | Line 18, | change "PdPc(OBu)$_3$. Rubrene," to --PdPc(OBu)$_8$. Rubrene,-- |

Signed and Sealed this
Seventeenth Day of October, 2023

Katherine Kelly Vidal
*Director of the United States Patent and Trademark Office*